United States Patent [19]

McCoy et al.

[11] 4,085,329
[45] Apr. 18, 1978

[54] HARD X-RAY AND FLUORESCENT X-RAY DETECTION OF ALIGNMENT MARKS FOR PRECISION MASK ALIGNMENT

[75] Inventors: John H. McCoy, Newbury Park; Paul A. Sullivan, Santa Monica, both of Calif.

[73] Assignee: Hughes Aircraft Company, Culver City, Calif.

[21] Appl. No.: 682,432

[22] Filed: May 3, 1976

[51] Int. Cl.² ............................................. G01N 21/34
[52] U.S. Cl. .................................. 250/492 A; 250/491
[58] Field of Search ................... 250/492 A, 272, 273, 250/278, 505, 320, 321, 491

[56] References Cited

U.S. PATENT DOCUMENTS

| | | | |
|---|---|---|---|
| 3,417,243 | 12/1968 | Hill | 250/272 |
| 3,742,229 | 6/1973 | Smith et al. | 250/492 A |
| 3,743,842 | 7/1973 | Smith et al. | 250/492 A |
| 3,920,984 | 11/1975 | Kirkendall et al. | 250/272 |

Primary Examiner—Alfred E. Smith
Assistant Examiner—B. C. Anderson

Attorney, Agent, or Firm—William J. Bethurum; W. H. MacAllister

[57] ABSTRACT

The specification describes a process wherein short wavelength or "hard" x-rays (less than about 4 Angstroms) are used to align a semiconductor processing mask with a semiconductor wafer without the requirement for thinning the wafer to permit the x-rays to pass through. These short wavelength x-rays may be obtained from either the continuum x-rays which accompany the "soft" (longer wavelength) characteristic x-rays used for resist exposure, or from a specialized source of hard x-rays. Alternatively, alignment marks may be provided on the surface of the wafer to project alignment-indicative fluorescent x-rays onto an x-ray detector without passing through the underlying semiconductor wafer. A null condition in the intensity of the "hard" x-rays, or the fluorescent x-rays in the alternative embodiment of the invention, which are received at an x-ray detector is indicative of an alignment between a reference mark on the mask and either a reference mark or an opening on the wafer.

3 Claims, 9 Drawing Figures

HARD X-RAY AND FLUORESCENT X-RAY DETECTION OF ALIGNMENT MARKS FOR PRECISION MASK ALIGNMENT

FIELD OF THE INVENTION

This invention relates generally to mask alignment techniques for semiconductor wafer processing and more particularly to an x-ray lithographic mask alignment process for replicating sub-micron line width patterns over large areas.

BACKGROUND AND PRIOR ART

In the art of x-ray lithography, as well as in other lithographic processes which are utilized to align selected mask patterns with the surfaces of semiconductor wafers to be processed, the use of alignment or "bench" reference marks on the mask is well known. By moving a reference mark (usually a metallic mesa) on the mask toward alignment with either a corresponding reference mark or an opening on the facing semiconductor wafer, and exposing both of these two reference areas to some form of electromagnetic radiation or particle bombardment, a radiation detector or the like can be utilized to produce a null signal to indicate complete alignment between the above two reference areas or marks. Such a process is disclosed, for example, in U.S. Pat. No. 3,742,229 issued to Henry I. Smith et al.

RELATED APPLICATION

In our copending patent application Ser. No. 469,154, entitled "Alignment System and Method with Micromovement Stage", we have disclosed and claimed certain novel improvements over the above-identified Smith et al. work. The particular mechanical transducer apparatus, as well as the closed loop electrical servo system of our above patent application, is adapted for use with the present invention. However, in both the work by Smith et al., as disclosed in U.S. Pat. No. 3,742,229, as well as our own process described in the above-identified copending application Ser. No. 469,154, the wafers processed therein were required to be selectively thinned in order to enable the long wavelength or "soft" x-rays used for resist exposure purposes to also be used for mask alignment purposes.

THE INVENTION

We have discovered a novel mask alignment process which no longer requires such wafer thinning and, thus, not only reduces wafer processing costs, but also increases process yields and throughputs and reduces the total time required for certain types of wafer processing operations.

Our invention resides in the discovery that short wavelength or "hard" x-rays, preferably on the order of 1 to 2 Angstroms wavelength, will pass through semiconductor wafers of conventional thicknesses (such as 0.2 to 0.5 millimeters) during the above-described alignment process while simultaneously being substantially attenuated during passage through the x-ray absorbing alignment marks on both the mask and the wafers to be aligned therewith. Furthermore, we have also discovered a novel technique whereby these short wavelength or hard x-rays may be obtained from the same x-ray source as is used for resist exposure purposes. Additionally, we have discovered an alternative process embodiment of our invention in which x-rays are focused on a fluorescent alignment mark which, upon fluorescence of the mark or adjacent substrate, projects alignment-indicative x-rays to an x-ray detector without even passing through the underlying semiconductor substrate, thereby rendering the substrate or wafer thickness inconsequential.

All of these mask alignment approaches are covered herein by a process wherein initially a substrate (semiconductor wafer) and an adjacent facing mask are moved toward alignment of predefined areas or marks thereon. Thereafter, short wavelength or "hard" x-rays, less than about 4 Angstroms wavelength, are projected to both these predefined reference areas on both the mask and wafer. The quantity of the hard x-rays then passing from these two reference areas to an x-ray detector is indicative of the extent to which these areas are aligned. Either open loop or closed loop control system techniques may be used in response to the detected signals in order to bring the mask and the wafer into complete alignment. In one embodiment of our invention, the hard x-rays are transmitted through the semiconductor wafer to an x-ray detector. In another embodiment of our invention the x-rays are utilized to fluoresce either a reference mark on the semiconductor wafer or the material adjacent to the reference mark on the semiconductor wafer which, in turn, projects hard x-rays directly onto a detector without passing through the underlying substrate. In the latter process, it is only necessary that the x-rays used to fluoresce the alignment mark be less than about 50 Angstroms.

Accordingly, it is an object of the present invention to provide a new and improved mask alignment process for use with x-ray lithography or other particle beam lithography techniques such as ion beam lithography (described in our copending application Ser. No. 626,425), electron image projection lithography or photolithography.

Another object is to provide a mask alignment process of the type described which exhibits a high resolution alignment capability without requiring thinning of wafers which are to be aligned with a mask.

A further object is to provide a mask alignment process of the type described which reduces wafer processing costs while increasing processing yields and throughputs.

Yet another object of the invention is to provide a mask alignment process of the type described which is readily adaptable for use with existing wafer positioning apparatus, including transducers and their associated electrical servo equipment, such as that disclosed and claimed in our above copending patent application Ser. No. 469,154.

A feature of this invention is the utilization of hard x-rays instead of soft x-rays for mask alignment purposes.

Another feature of this invention is the utilization of continuum x-rays as a source of hard x-rays for the x-ray detection of mask alignment, thereby making unnecessary a separate source of x-rays for alignment purposes.

Another feature of this invention is a utilization of specialized hard x-ray sources which are separate from the x-ray resist exposure source and are utilized solely for mask alignment purposes.

A further feature of this invention is the provision of a specialized direct-electron-bombarded source of hard x-rays for purposes of mask alignment by either x-ray transmission or fluorescence.

A further feature of this invention is the provision of a special dual focus secondary fluorescent source of x-rays for fluorescent mask alignment purposes.

A further feature of this invention is the detection of fluorescent x-rays through a thin mask without passing through a semiconductor wafer.

These and other objects and features of the invention will become more readily apparent in the following description of the accompanying drawings.

BRIEF DESCRIPTION OF THE DRAWINGS

FIG. 6 shows two variations in the back fluorescent detection scheme.

DESCRIPTION OF PREFERRED EMBODIMENTS

Figure 1:
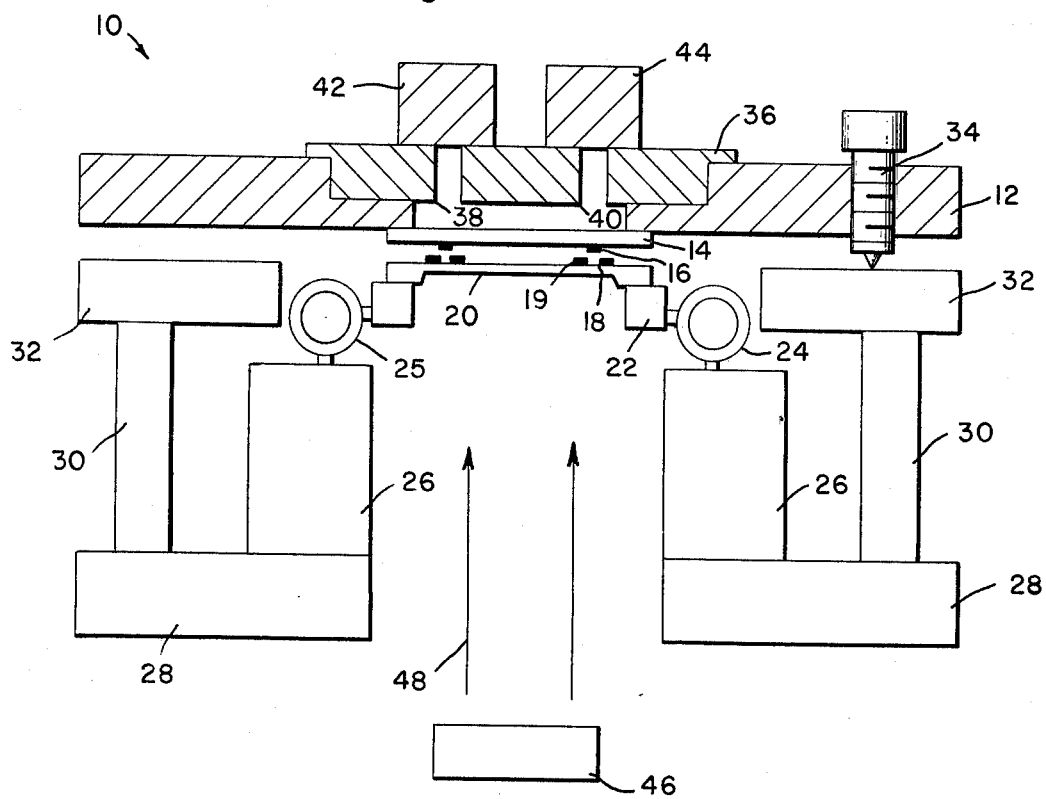
FIG. 1 is a schematic diagram of a mask alignment apparatus and related process according to one embodiment of our invention. The apparatus comprises a source of hard x-rays, a means for producing relative motion between a mask and an adjacent facing semiconductor wafer, and two x-ray detectors which are positioned over the alignment marks on the mask and wafer.

Referring now to FIG. 1, the mask alignment system shown therein, generally designated 10, includes a main wafer carrier member 12 upon which a semiconductor wafer 14 is securely mounted. The wafer 14 has a reference or "bench" mark 16 positioned thereon, and this mark 16 is to be aligned with an opening 18 in a mask 19 which is disposed on the upper surface of a thin mask membrane 20. The mask 20 is in turn mounted on a mask carrier 22 which is coupled to piezoelectric transducers 24 and 25 whose function is to bring the opening 18 and benchmark 16 on the mask and wafer, respectively, into precise alignment in accordance with the teachings of this invention. However, the exact mechanical nature of the carrier 22 and the piezoelectric transducer 24 are not described herein in detail, but are described in more detail in our copending application Ser. No. 469,154, by John H McCoy and Paul A. Sullivan and also in a publication entitled "Precision Mask Alignment for X-Ray Lithography", 7th International Conference on Electron and Ion Beam Science and Technology, Washington, D.C., May 3–7, 1976.

A baseplate member 28 is joined by a support member 30 to a top plate member 32, and the top plate member 32 is controllably spaced from the wafer carrier member 12 by means of a wafer-mask separation differential screw 34. This screw 34 controls the exact spacing between members 12 and 32 for a particular mask alignment operation.

A central detector support member 36 is positioned as shown in a central recessed portion of the water carrier 12 and includes a pair of openings 38 and 40 therein which expose the radiation sensitive surfaces of a pair of x-ray detectors 42 and 44 which are mounted on the top side of the member 36. When the reference mark 16 is completely aligned with the mask opening 18, then the x-rays from the source 46 are completely blocked from the detectors 42 and 44, thus producing a null condition in the electronic circuitry (not shown) to which the left and right detectors 42 and 44 are electrically coupled. The electronic closed loop servo system disclosed in our above-identified copending application Ser. No. 469,154 may be used for processing signals from these detectors 42 and 44 to provide the necessary mechanical error correction impulses at the transducers 24 and 25 for bringing the reference mark 16 and opening 18 into precise alignment.

The X-rays 48 emanating from the x-ray source 46 are so-called "hard" x-rays or x-rays typically on the order of one to two Angstroms wavelength. The actual source detail for such x-rays 48 is described hereinafter, and an analysis of the response of the x-ray detectors 42 and 44 shows that the signal from these detectors is proportional to $J \cdot L \cdot (1 - \epsilon_A) x O$, where $J$ is the effective photon flux passing through the wafer 14 and thin part of the mask 20, $L$ is the effective length of the mark set 16 (in one dimension), $x_O$ is the displacement error of misalignment between the mark 16 and the opening 18, and $\epsilon_A$ is the fraction of x-rays transmitted through the absorber pattern 19.

The noise-limited alignment accuracy of the systems in all embodiments shown herein is determined by the shot or quantum noise of the detected signal. The chief noise source is the shot noise in the background x-rays transmitted through the mask and wafer and through the aligned absorber marks. This background is limited by the aperture area A of the detector. The noise limited performance for the transmission system is then $$n = \frac{\Delta f}{J_0} \frac{1}{\pi 2^{\frac{1}{2}}} \frac{\epsilon_A}{(\epsilon_M \epsilon_W)^{\frac{1}{2}}(1-\epsilon_A)} \frac{A^{\frac{1}{2}}}{L} \quad (1)$$

where $\Delta f$ is the servo bandwidth of the closed loop feedback system, $J_0$ is the x-ray flux incident upon the mask; and $\epsilon_M$ and $\epsilon_W$ are the transmission fractions of the mask and the wafer, respectively.

Figure 2:
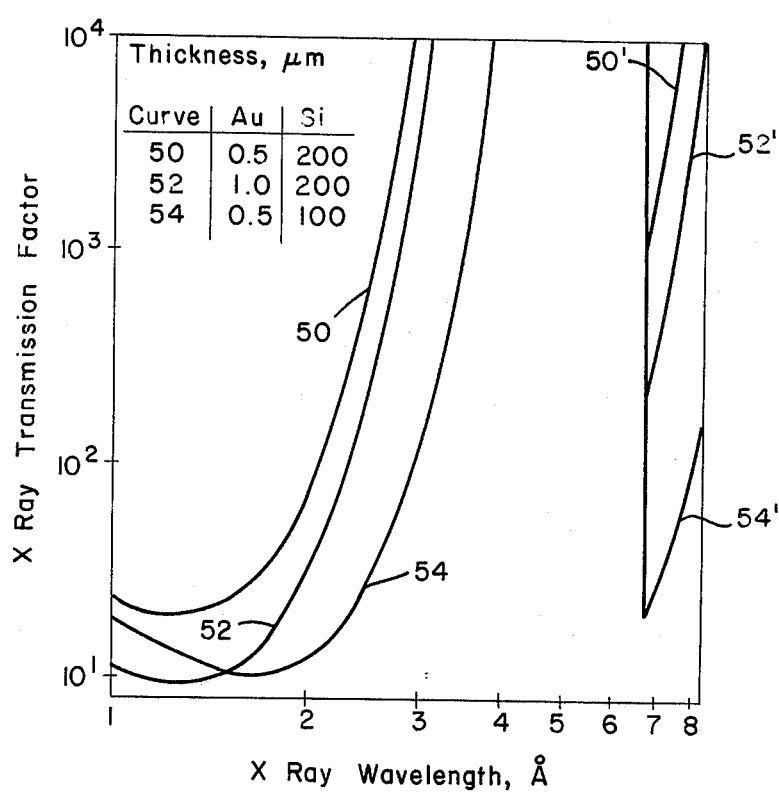
FIG. 2 is a graph plotting x-ray transmission factor versus x-ray wavelength for various mask absorber combinations and illustrating the advantageously low values of transmission factor obtained for wavelengths below about 3 Angstroms.

The transmission factor in Equation 1 (the function of $\epsilon_A$, $\epsilon_W$ and $\epsilon_M$) is plotted as a function of wavelength in FIG. 2. Minimum values for this transmission factor correspond to the greatest alignment accuracy. This x-ray transmission factor was calculated using the wavelength dependence of the mass absorption coefficients from Heinrich as updated in our publication entitled "Determination of Wavelength and Excitation Voltage for X-Ray Lithography", supra. The curves shown in FIG. 2 are dominated by the values of $\epsilon_A$ and $\epsilon_W$, and $\epsilon_M$ has little influence upon the shape of the curves. The $\epsilon_M$ factors for silicon masks and Mylar masks are about equal. This transmission factor must be minimized to give the lowest noise, $n$, and one can achieve a factor under 200 at the Al K wavelength (8.34 Angstroms) only by thinning the silicon wafer to about 100m. However, wafers of normal thickness, e.g. 200m, can be used with x-rays in the 1 to 2 A region. The $(1-\epsilon_A)$ factor described the absorber contrast and causes the rise in transmission factor below 1 A. Since special thinning of the wafer is undesirable, the use of a short wavelength radiation such as Cu K (1.5 A) x-rays is desirable for alignment.

Figure 3:
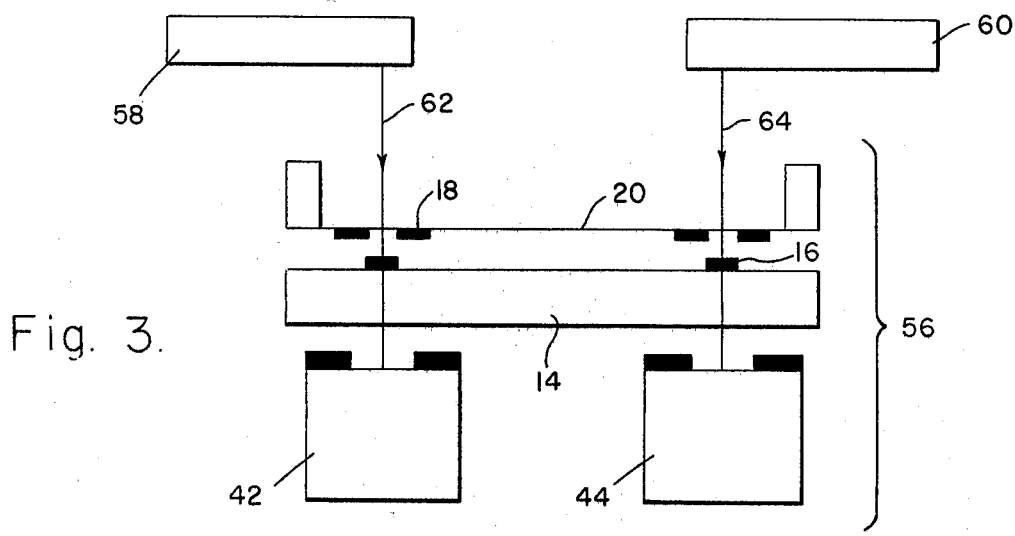
FIG. 3 is a schematic diagram of one transmission detection system and process according to our invention and utilizing separate sources of short wavelength x-rays for alignment purposes. The means for producing relative motion between the mask and wafer are omitted for clarity.

Referring now to FIG. 3, the portion of this figure identified as 56 is identical to the corresponding wafer, mask and x-ray detector portions of FIG. 1, and as such carries the same reference numerals. However, in FIG. 3 a pair of copper target x-ray sources 58 and 60 are utilized to project x-ray beams 62 and 64, respectively, towards the x-ray detectors 42 and 44. The copper target x-ray sources 58 and 60 are each comprised of a copper target which is bombarded by an electron beam at about 40 kV potential and a current of approximately 0.25 milliamperes. Each of these sources 58 and 60 is aligned with the particular x-ray detector 42 and 44 indicated and with the complementary pair of alignment marks on the mask and wafer 20 and 14. After the wafer 14 and mask 20 have been aligned using the closed loop control type of feedback system identified above, x-ray lithography replication may proceed by exposing the resist coated wafer 14 with "soft" x-rays which are derived from another x-ray source. These soft x-rays reproduce an absorber pattern (not shown) on the central portion of the mask 20 by shadow projection. The x-ray sources 58 and 60 may remain in the position shown in order to maintain wafer and mask alignment during this subsequent resist exposure process.

Figure 4:
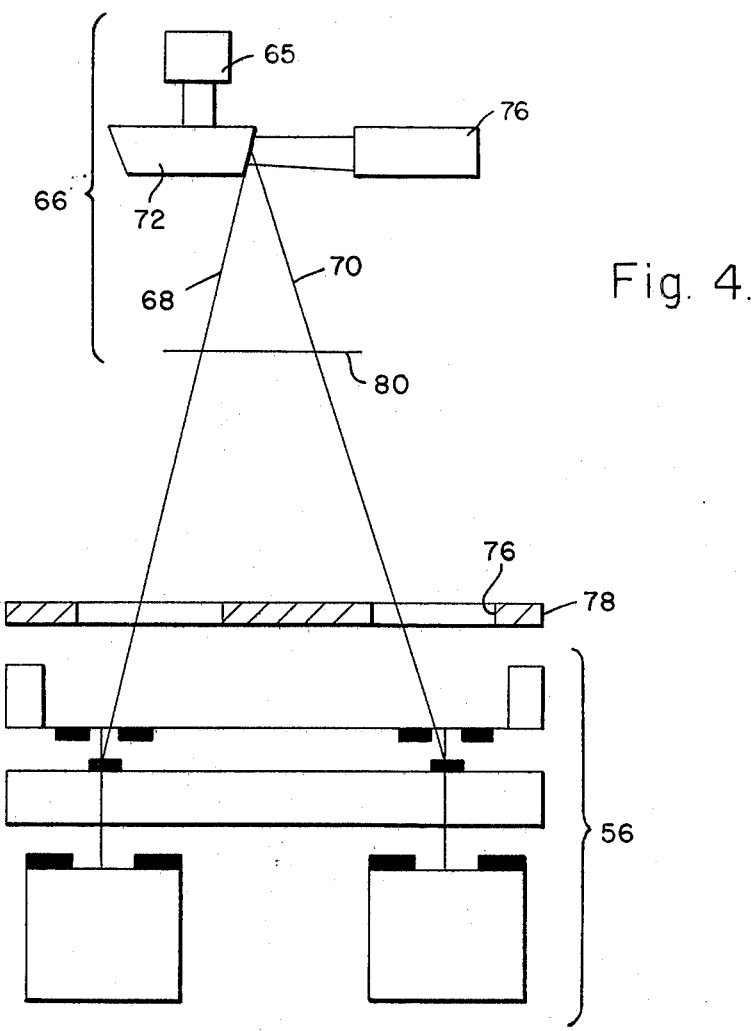
FIG. 4 is a schematic diagram of another transmission detection system and process according to our invention and using a continuum source of alignment x-rays. This system may provide continuous alignment during simultaneous resist exposure, or a suitable aperture may be used so that only the alignment marks are illuminated by the source during alignment. The means for positioning the mask and wafer are omitted for clarity.

Referring now to FIG. 4, there is shown a single source 66 for x-rays 68 and 70, and this source provides both hard x-rays for alignment and soft x-rays for exposure as described below with reference to FIGS. 5a and 5b. The surface of the rotating target 72 is continually exposed to electron bombardment from an electron gun 74 operated at 10 to 40 kV potential. The hard x-rays emitted from the surface 72 pass through apertures 76 in a mask 78 which may be used to shield the resist coating on the wafer 14 during the mask alignment process. Advantageously, the x-ray source 66 may be enclosed in a vacuum chamber (not shown) containing a vacuum window 80 which allows x-rays generated by the rotating target 72 to pass out of the chamber to the mask alignment and exposure system, which is preferably at atmospheric pressure. Advantageously, the target 72 of the x-ray source 66 may be rotated by a motor 65 to allow greater power dissipation in the target. After the mask alignment procedure is completed, the apertured mask 78 is removed and the exposure of resist on the wafer 14 using x-rays from the target 66 may continue.

Figure 5A:
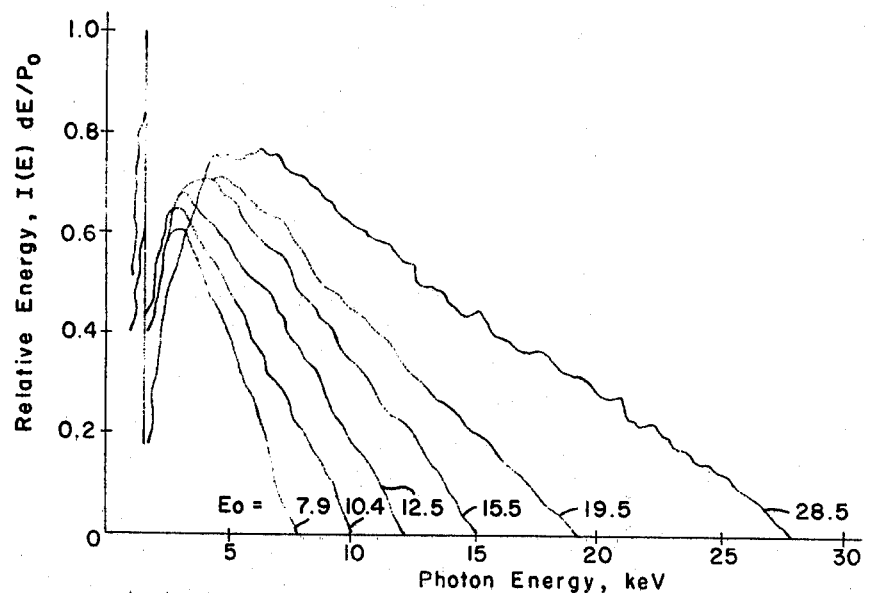
FIG. 5a is a graph of x-ray emission spectra from an aluminum target for various electron beam excitation voltages, $E_O$, normalized to constant excitation power. This figure illustrates the intensity of short wavelength continuum x-rays with relation to the peak of aluminum characteristic x-rays at 8.34 Angstrom wavelength. This data was reported by P. A. Sullivan and J. H. McCoy, "Determination of Wavelength and Excitation Voltage for X-Ray Lithography," IEEE Trans. on Electron Devices, ED-23, April, 1976.
Figure 5B:
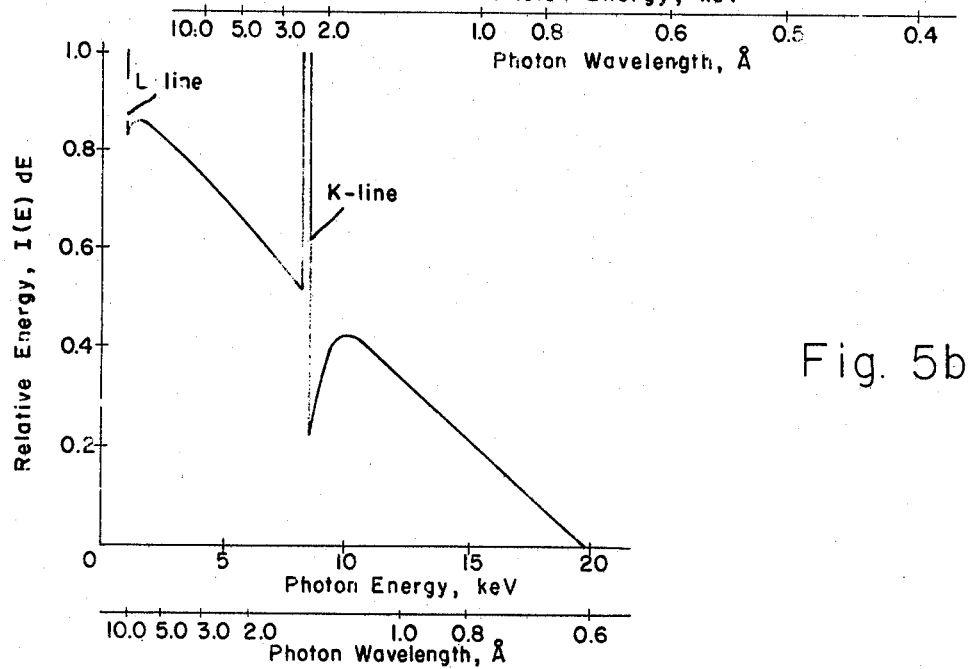
FIG. 5b is a graph of the x-ray emission spectrum from a copper target excited with a 20 kV electron beam, and this graph shows the position of the characteristic emission lines at 1.5 and 13.3 Angstroms.

Referring now to FIGS. 5a and 5b, both hard and soft x-rays are simultaneously available from the electron bombarded x-ray target 66 (FIG. 4), provided that this target is operated at sufficiently high voltages, as illustrated by the data in FIG. 5a. The example shown in FIG. 5a is the x-ray spectrum from an aluminum target bombarded with an electron beam energies of 7.9, 10.4, 12.5, 15.5, 19.5 or 28.5 kV. In addition to the aluminum characteristic K x-rays with 1.5 keV energy (8.34 Angstroms wavelength), there is a background or continuum spectrum of x-rays which extend up to the electron beam excitation voltage. There is a sufficient quantity of x-rays in this continuum with a wavelength shorter than 3 Angstroms to implement the above-described hard x-ray transmission alignment process using the arrangement of FIG. 4. However, other selected targets besides aluminum are commonly used in x-ray lithography, and when such other targets are excited by electron bombardment, they all produce a continuum of short wavelength x-rays which are suitable for hard x-ray transmission alignment.

One preferred x-ray source for x-rays lithography is an electron bombarded copper target whose characteristic L X-rays at 0.93 keV energy (13.3 Angstroms wavelength) are suitable for high resolution resist exposure. As is noted above, copper K characteristic x-rays with an energy of 8.05 keV (1.5 Angstroms wavelength) are suitable for the hard x-ray transmission alignment process, and the x-ray spectrum for such a copper target x-ray source is qualitatively plotted in FIG. 5b. Thus, the embodiment of FIG. 4 using a copper target 66 x-ray source is uniquely suited for the simultaneous generation of hard (1.5 Angstrom wavelength) x-rays for mask alignment purposes and the soft (13.3 Angstroms wavelength) x-rays for the subsequent exposure of resist.

Figure 6A:
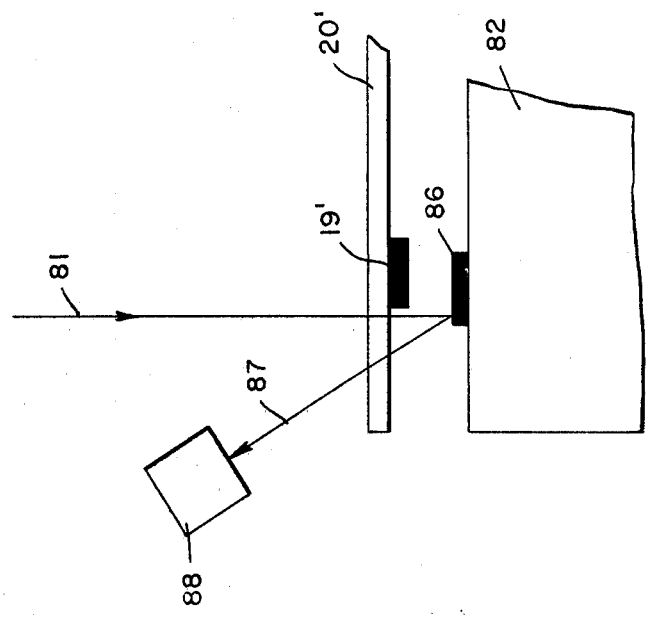
In FIG. 6a complementary alignment marks are used and the wafer surface (or coating thereon) fluoresces when struck in misalignment.

Referring now to FIG. 6, there are shown two methods of back fluorescent detection which represent alternative embodiments of our invention. This detection system was constructed to overcome the x-ray attenuation limitations imposed on previous systems by thick semiconductor wafers. In FIG. 6a the alignment marks are complementary in nature as in FIG. 1. In this case, however, the incident x-rays 81 which pass through the opening in mark 19 are allowed to strike the wafer (or its coating) 82 only when mark 83 is misaligned. The wafer or coating 82 fluoresces when struck by x-rays; that is, it produces x-rays 84 characteristic of the material 82. These x-rays 84 are transmitted back through the thin mask 20 with little attentuation and are detected by detector 85. A null in the detected signal indicates alignment because fewer of the incident x-rays 81 strike the wafer or its coating 82 because of absorption in the wafer mark 83.

Figure 6B:
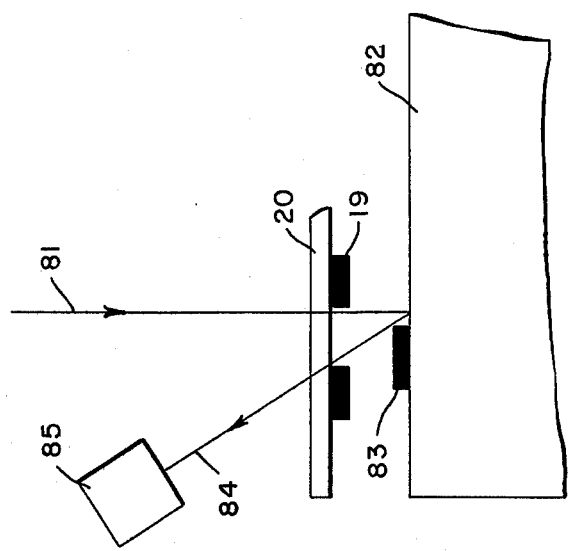
In FIG. 6b identical shaped marks are used and the wafer mark fluoresces.

In FIG. 6b another embodiment of our invention is shown in which alignment marks 19' and 86 are identical in shape. When wafer mark 86 is not covered by mask mark 19', x-rays 81 strike the mark 86 and it fluoresces, emitting x-rays 87 which are characteristic of the material 86. The x-rays 87 are transmitted back through thin mask 20' to the detector 88. In this variation the wafer material or coating 82 is not significant so long as unwanted fluorescence is not produced.

Figure 7:
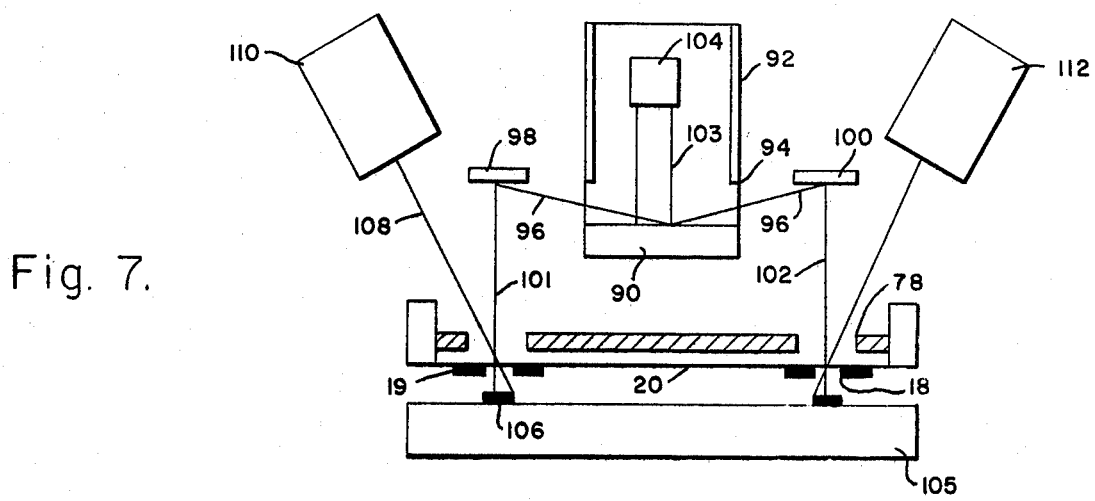
FIG. 7 is a schematic diagram of the back fluorescent detection system and process according to our invention. The apparatus comprises two small sources of spectrally pure x-rays (shown here as produced by fluorescence from a single primary x-ray source), an aperture mask, a mask and wafer of suitably selected materials with suitable alignment marks, and two x-ray detectors. In addition, the apparatus shown in FIG. 7 is adapted for use with means for mechanically aligning the mask and wafer, and null indicators may be attached to the x-ray detectors to indicate when correct alignment is achieved.

The system of FIG. 7 is a specific embodiment of FIG. 6a. It includes a copper target 90 which is positioned at the lower portion of a vacuum chamber 92 having windows 94 therein through which x-rays 96 may pass from the copper target to a pair of fluorescers 98 and 100. As in the previously described FIG. 4, the copper target 90 is bombarded by electrons 103 from an electron gun 104 which is mounted as shown above the copper target 90. In one example of practicing the invention, the hard x-rays 96 projected at the angle shown from the copper target 90 are Cu $K_\alpha$ x-rays at 8.050 electron volts energy, and they are projected onto the two fluorescers 98 and 100 which may be, for example, a compound of $PN_3$ fluorescer material. Such material is suitable for projecting $PK_\alpha$ x-rays at 2,014 electron volts energy through the mask membrane 20, through the openings 18 in the gold mask 19 and onto the wafer or wafer coating 105 adjacent to the absorber mark 106.

The above-produced phosphorous x-rays 101 are very efficient for exciting silicon K x-rays 108 at 1740 eV energy (7.13 Angstroms wavelength) from a substrate 105 containing silicon, such as a silicon wafer, or a semiconductor wafer (substrate) which has been coated with silicon monoxide, silicon dioxide or a polycrystalline silicon film. For this embodiment, the absorbing marks 19 and 106 are preferably a heavy metal, such as gold or tantalum, and have the complementary configuration of FIG. 6a. These materials effectively attenuate the 2014 eV incident x-rays 101 and no fluorescent excitation occurs in them. The aperture mask 78 limits the incident x-rays to the mark areas.

The mask support member 20 may be any low atomic number material except silicon, for example, a hydrocarbon plastic film or beryllium. The fluorescent x-rays excited in these materials are of sufficiently low energy that the detectors 110 and 112 will not respond to them.

The silicon K x-rays are detected by two x-ray detectors 110 and 112 respectively as shown. These detectors 110 and 112 receive minimum x-ray quanta from the fluorescer material on the wafer 105 when the mark 106 is in complete alignment with the corresponding opening 18 in the gold mask 19. Such complete alignment enables the mark 106 to completely absorb the phosphorous x-rays from the fluorescers 98 and 100 and produce a null condition at the two x-ray detectors 110 and 112.

The second type of back fluorescent detection as indicated in FIG. 6b can be implemented by substituting the identical geometry marks of FIG. 6b for the marks 19 and 106 in FIG. 7. When tantalum is used as the mark 106, fluorescent tantalum x-rays 108 at 8.15 keV and 9.34 keV energies may be excited by x-rays 101 of higher energy. Gold is commonly used as the absorber material 19 on the mask 20. However, it is desirable not to excite fluorescent x-rays from the gold alignment mark 19, and to accomplish this, the x-rays 101 should have an energy less than about 11.9 keV, so as not to excite the gold characteristic L lines.

Suitable fluorescer materials 98 and 100 are compounds of mercury instead of $PN_3$, with a characteristic emission line at 11.8 keV, or aresenic compounds with a characteristic emission line 11.7 keV. Additionally, mercury or arsenic compounds for fluorescers 98 and 100 should be excited using a molybdenum target 90 (instead of the copper target x-ray source) and by using an electron beam 103 accelerated to about 40 kV. The characteristic molybdenum K x-rays 96 at 17 keV energy (0.71 Angstroms wavelength) would be principally responsible for exciting the fluorescers 98 and 100 containing mercury or arsenic.

By inspection of FIG. 7, it will be appreciated that the x-rays 108 do not pass through the wafer 105, so that the thickness of the wafer 105 in FIG. 7 is of no consequence in the process described. Furthermore, the two fluorescing sources 98 and 100 of phosphorous x-rays produce spectrally pure x-rays 101 which are produced by exciting the fluorescent materials 98 and 100 with x-rays 96 from a conventional copper x-ray target 90. One unique feature of the above x-ray source arrangement is the ability to easily adjust the distance between the fluorescers 98 and 100 to accommodate various combinations of mask and wafer sizes. Additionally, the x-rays 101 produced by the above-described technique have a single discrete energy which is characteristic of the $PN_3$ material of the fluorescers 98 and 100. That is, there is no continuous spectrum of radiation at other wavelengths as there is in the x-ray emission spectrum characteristic of an electron bombarded target. However, the x-rays 96 which excite the fluorescers 98 and 100 must have a higher energy than the characteristic emission line of the fluorescers 98 and 100.

It should be noted that the above-described alignment system of FIG. 7 relies upon the excitation of characteristic x-rays either from a material in or on the substrate 105 or in the reference alignment mark 106, but not both. Thus, materials for the substrate 105, the reference alignment mark 106, as well as the energy of the exciting x-rays 101, must be carefully chosen. Only then will the detectors 110 and 112 properly respond to a change in the intensity of the x-rays 108 as the mask and wafer are brought into alignment.

What is claimed is:

1. A process for aligning a reference area on a mask with a reference area on a substrate which includes:
   (a) bringing the substrate and mask toward alignment of said reference areas on their respective surfaces,
   (b) illuminating said reference area on said substrate to cause it to fluoresce, and
   (c) sensing the quantity of fluorescent x-rays from said reference area on said substrate as indicative of the extent to which said reference areas are aligned.

2. The process defined in claim 1 wherein said reference area is illuminated with x-rays with wavelengths less than about 50 Angstroms.

3. A process for aligning a reference area on a mask with a corresponding reference area on a substrate including the steps of:
   (a) bringing the substrate and mask toward alignment of said reference areas on their respective surfaces,
   (b) bombarding a primary target with an electron beam of energy sufficient to produce x-rays thereat which irradiate two or more secondary fluorescent targets and excite characteristic fluorescent x-rays at said secondary fluorescent targets,
   (c) projecting said characteristic fluorescent x-rays from said secondary targets to said reference areas on said mask and substrate respectively, and
   (d) sensing the quantity of x-rays received from both said reference areas as indicitive of the extent to which said reference areas are aligned, whereby the distance between said secondary targets and said primary targets may be adjusted for a particular mask alignment operation.

* * * * *